(12) United States Patent
Nishiyama et al.

(10) Patent No.: US 12,095,007 B2
(45) Date of Patent: Sep. 17, 2024

(54) LIGHT-EMITTING ELEMENT AND METHOD FOR MANUFACTURING LIGHT-EMITTING ELEMENT

(71) Applicant: NICHIA CORPORATION, Anan (JP)

(72) Inventors: Hirofumi Nishiyama, Tokushima (JP); Shunsuke Minato, Anan (JP)

(73) Assignee: NICHIA CORPORATION, Anan (JP)

( * ) Notice: Subject to any disclaimer, the term of this patent is extended or adjusted under 35 U.S.C. 154(b) by 420 days.

(21) Appl. No.: 17/525,230

(22) Filed: Nov. 12, 2021

(65) Prior Publication Data

US 2022/0158033 A1     May 19, 2022

(30) Foreign Application Priority Data

Nov. 17, 2020 (JP) ................. 2020-190816

(51) Int. Cl.
   *H01L 33/32*        (2010.01)
   *H01L 33/00*        (2010.01)
   *H01L 33/38*        (2010.01)
   *H01L 33/62*        (2010.01)

(52) U.S. Cl.
   CPC .......... *H01L 33/32* (2013.01); *H01L 33/0075* (2013.01); *H01L 33/382* (2013.01); *H01L 33/62* (2013.01); *H01L 2933/0016* (2013.01)

(58) Field of Classification Search
   CPC ................. H01L 33/32; H01L 33/0075; H01L 33/382; H01L 33/62; H01L 2933/0016; H01L 33/04; H01L 27/153; H01L 33/00–648; H01L 27/15–156; H01L 2933/00–0091; H01L 33/483–486; H01L 2933/0033; H01L 2933/0025; H01L 33/50–508; H01L 2933/0041; H01L 33/44; H01L 33/52–56; H01L 2933/005; H01L 33/54; H01L 33/58–60; H01L 2933/0058; H01L 33/64–648; H01L 2933/0075;
   (Continued)

(56) References Cited

U.S. PATENT DOCUMENTS

| 2005/0127391 A1 | 6/2005 | Yanamoto |
| 2005/0205881 A1 | 9/2005 | Yamazoe et al. |
| 2012/0018765 A1 | 1/2012 | Mizogami et al. |

(Continued)

FOREIGN PATENT DOCUMENTS

| JP | 2001-077480 A | 3/2001 |
| JP | 2001-144378 A | 5/2001 |

(Continued)

*Primary Examiner* — Mohammad A Rahman
(74) *Attorney, Agent, or Firm* — Foley & Lardner LLP (57) ABSTRACT

A light emitting element includes a first light emitting portion and a second light emitting portion. The first light emitting portion includes a first stacked body having a first n-type layer, a first active layer, a first p-type layer, a first tunnel junction layer, and a second n-type layer. The second light emitting portion includes a second stacked body having a third n-type layer, a second p-type layer, a second tunnel junction layer, a fourth n-type layer, a second active layer, a third p-type layer, and a transmissive conductive film. A resistivity of the second n-type layer is higher than a resistivity of the transmissive conductive film. A thickness of the second n-type layer is larger than a thickness of the transmissive conductive film.

16 Claims, 7 Drawing Sheets

(58) Field of Classification Search
CPC ............. H01L 2933/0083; H01L 33/22; H01L 33/20; H01L 51/5262
See application file for complete search history.

(56) References Cited

U.S. PATENT DOCUMENTS

| | | |
|---|---|---|
| 2013/0099198 A1 | 4/2013 | Tanaka |
| 2015/0030046 A1 | 1/2015 | Aoki et al. |
| 2017/0213868 A1 | 7/2017 | Damilano et al. |
| 2019/0074405 A1 | 3/2019 | Okuno |
| 2019/0198561 A1 | 6/2019 | Wildeson et al. |
| 2021/0193731 A1* | 6/2021 | Armitage ............ H01L 33/0075 |

FOREIGN PATENT DOCUMENTS

| | | |
|---|---|---|
| JP | 2001-358364 A | 12/2001 |
| JP | 2002-335052 A | 11/2002 |
| JP | 2003-273473 A | 9/2003 |
| JP | 2005-101536 A | 4/2005 |
| JP | 2005-259971 A | 9/2005 |
| JP | 2005-260215 A | 9/2005 |
| JP | 2012-028381 A | 2/2012 |
| JP | 2013-093399 A | 5/2013 |
| JP | 2014-053593 A | 3/2014 |
| JP | 2015-026659 A | 2/2015 |
| JP | 2017-513225 A | 5/2017 |
| JP | 2018-032798 A | 3/2018 |
| JP | 2019-047090 A | 3/2019 |

* cited by examiner

LIGHT-EMITTING ELEMENT AND METHOD FOR MANUFACTURING LIGHT-EMITTING ELEMENT

CROSS-REFERENCE TO RELATED APPLICATION

This application claims priority to Japanese Patent Application No. 2020-190816, filed on Nov. 17, 2020, the disclosure of which is hereby incorporated by reference in its entirety.

BACKGROUND

The present disclosure relates to a light-emitting element and a method for manufacturing a light-emitting element.

For example, JP-T-2017-513225 (the term "JP-T" as used herein means a published Japanese translation of a PCT patent application) discloses a semiconductor stacked structure in which a tunnel junction is inserted between multiple active layers having different emission wavelengths.

SUMMARY

An object of certain embodiment of the present disclosure is to provide a light-emitting element and a method for manufacturing a light-emitting element capable of controlling individual lighting of a first light-emitting portion and a second light-emitting portion obtained by a semiconductor stacked body including a tunnel junction layer.

According to one embodiment of the present disclosure, a light-emitting element includes a first light-emitting portion including a first stacked body made of a nitride semiconductor, a first p-side electrode, and a first n-side electrode; and a second light-emitting portion including a second stacked body made of a nitride semiconductor, a second p-side electrode, and a second n-side electrode. The first stacked body includes a first n-type layer; a first active layer disposed on the first n-type layer; a first p-type layer disposed on the first active layer; a first tunnel junction layer disposed on the first p-type layer; and a second n-type layer disposed on the first tunnel junction layer. The first p-side electrode is disposed on the second n-type layer and being electrically connected to the second n-type layer. The first n-side electrode is disposed on the first n-type layer and is electrically connected to the first n-type layer. The second stacked body includes a third n-type layer; a second p-type layer disposed on the third n-type layer; a second tunnel junction layer disposed on the second p-type layer; a fourth n-type layer disposed on the second tunnel junction layer; a second active layer disposed on the fourth n-type layer; a third p-type layer disposed on the second active layer; and a transmissive conductive film disposed on the third p-type layer. The second p-side electrode is disposed on the transmissive conductive film and being electrically connected to the third p-type layer. The second n-side electrode is disposed on the fourth n-type layer and being electrically connected to the fourth n-type layer. A resistivity of the second n-type layer is higher than a resistivity of the transmissive conductive film. And a thickness of the second n-type layer is larger than a thickness of the transmissive conductive film.

According to one embodiment of the present disclosure, a method for manufacturing a light-emitting element includes preparing a semiconductor stacked body configured with a nitride semiconductor layer including a first n-type layer disposed on a substrate, a first active layer disposed on the first n-type layer, a first p-type layer disposed on the first active layer, a tunnel junction layer disposed on the first p-type layer, a second n-type layer disposed on the tunnel junction layer, a second active layer disposed on the second n-type layer, and a second p-type layer disposed on the second active layer; forming a transmissive conductive film having a resistivity lower than a resistivity of the second n-type layer on the second p-type layer in a first region of the semiconductor stacked body; removing the second p-type layer and the second active layer in a second region of the semiconductor stacked body to expose an upper surface of the second n-type layer in the first region and allow the second n-type layer having a thickness larger than a thickness of the transmissive conductive film to remain on an uppermost layer in the second region; removing a portion of the second n-type layer, a portion of the tunnel junction layer, a portion of the first p-type layer, and a portion of the first active layer in the second region and exposing an upper surface of the first n-type layer in the second region from the semiconductor stacked body; and forming electrodes on an upper surface of the transmissive conductive film, the upper surface of the second n-type layer in the first region, an upper surface of the second n-type layer in the second region, and the upper surface of the first n-type layer.

According to certain embodiments of the present disclosure, it is possible to provide a light-emitting element and a method for manufacturing a light-emitting element capable of controlling individual lighting of a first light-emitting portion and a second light-emitting portion obtained by a semiconductor stacked body including a tunnel junction layer.

DETAILED DESCRIPTION

Embodiments will now be described with reference to the drawings. The same components in the drawings are labeled with the same reference numerals.

Figure 1:
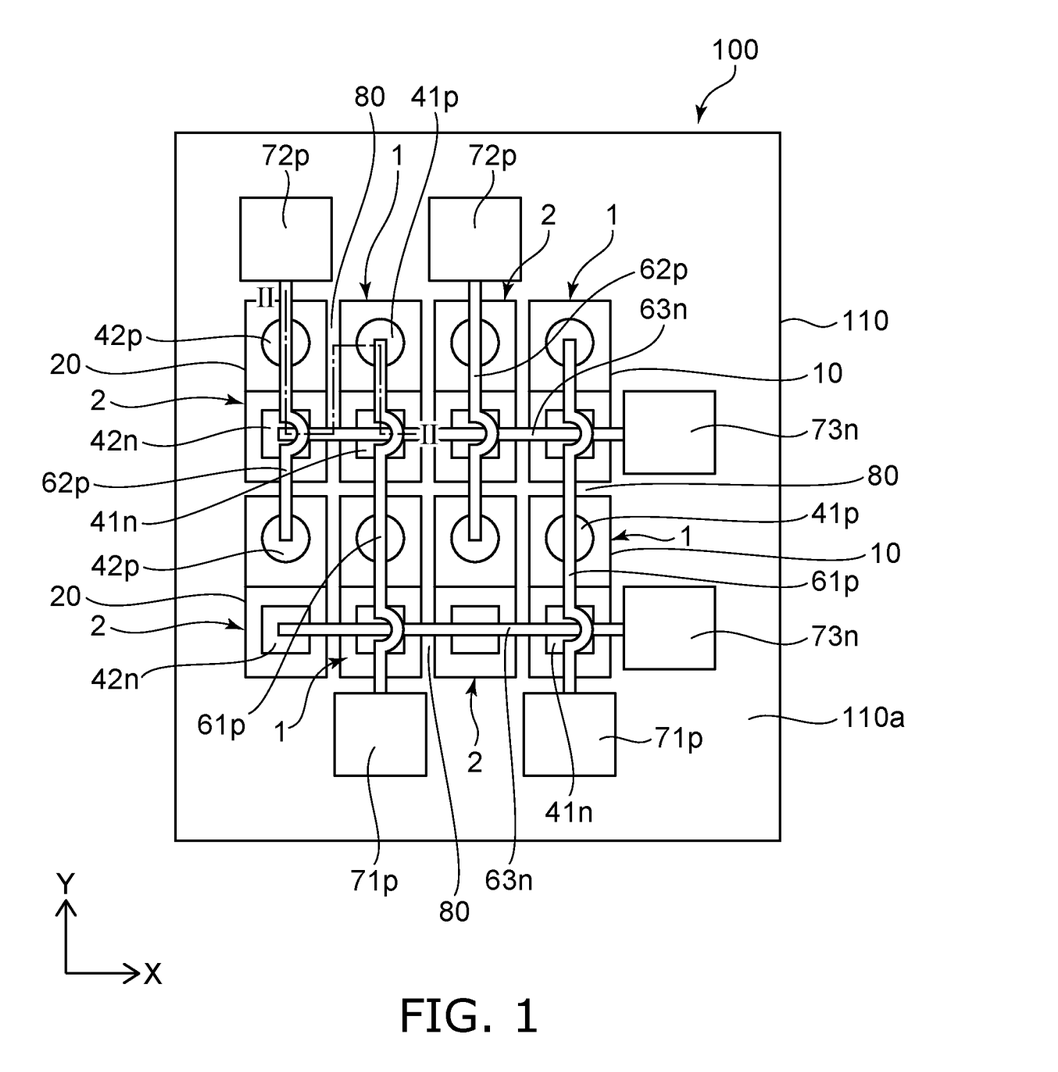
FIG. 1 is a schematic plan view showing a portion of a configuration of a light-emitting element according to an embodiment of the present disclosure.

FIG. 1 is a schematic plan view showing a portion of a configuration of a light-emitting element 100 according to an embodiment of the present disclosure.

The light-emitting element 100 includes a substrate 110, multiple first light-emitting portions 1 disposed on the substrate 110, and multiple second light-emitting portions 2 disposed on the same substrate 110.

Two directions orthogonal to each other in a plane parallel to a main surface 110a of the substrate 110 are referred to as a first direction X and a second direction Y. The first light-emitting portions 1 and the second light-emitting portions 2 are alternately disposed in the first direction X. In addition, the first light-emitting portions 1 are disposed adjacent to each other in the second direction Y, and the second light-emitting portions 2 are disposed adjacent to each other in the second direction Y. It is noted that the arrangement relationship between the first light-emitting portion 1 and the second light-emitting portion 2 is not limited to the example shown in FIG. 1.

Figure 2:
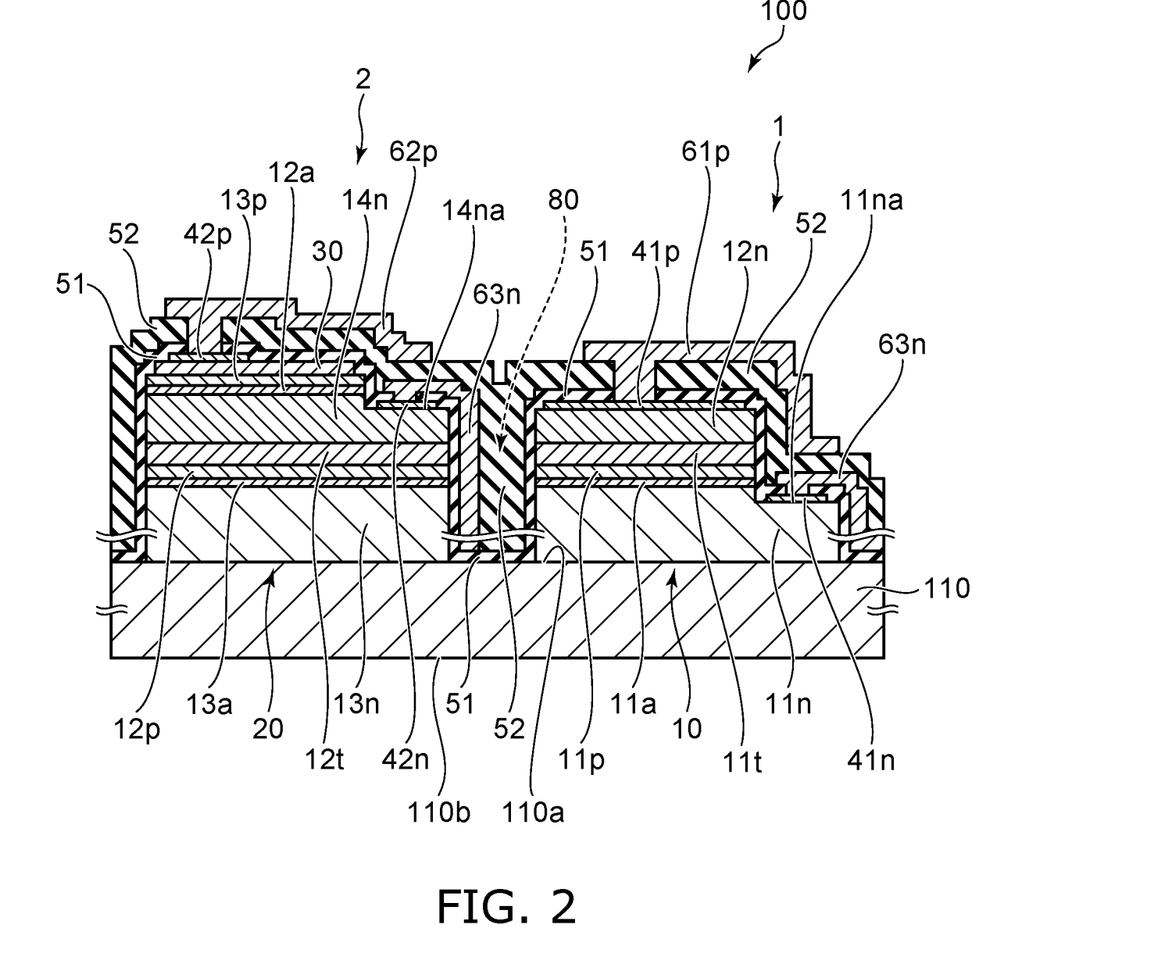
FIG. 2 is a schematic cross-sectional view taken along the line II-II of FIG. 1.

FIG. 2 is a schematic cross-sectional view taken along the line II-II of FIG. 1.

The first light-emitting portion 1 includes a first stacked body 10 made of a nitride semiconductor, a first p-side electrode 41p, and a first n-side electrode 41n. The second light-emitting portion 2 includes a second stacked body 20 made of a nitride semiconductor, a second p-side electrode 42p, and a second n-side electrode 42n. The first stacked body 10 and the second stacked body 20 are provided separately from each other on one substrate 110 by a groove 80. The main surface 110a of the substrate 110 is exposed on the bottom surface of the groove 80.

In the specification, the term "nitride semiconductor" includes, for example, semiconductors of all compositions where composition ratios x and y are changed within respective ranges in chemical formulas $In_xAl_yGa_{1-x-y}N$ ($0 \leq x \leq 1$, $0 \leq y \leq 1$, $x+y \leq 1$). In addition, in the above-mentioned chemical formulas, materials further containing group V elements other than N (nitrogen) and materials further containing various elements added to control various physical properties such as a conductivity type are also included in the "nitride semiconductor".

The first stacked body 10 includes a first n-type layer 11n, a first active layer 11a disposed on the first n-type layer 11n, a first p-type layer 11p disposed on the first active layer 11a, a first tunnel junction layer 11t disposed on the first p-type layer 11p, and a second n-type layer 12n disposed on the first tunnel junction layer 11t.

The first n-type layer 11n and the second n-type layer 12n contain, for example, silicon (Si) as an n-type impurity. The first p-type layer 11p contains, for example, magnesium (Mg) as a p-type impurity. The first active layer 11a is a light-emitting layer that emits light and has, for example, a multiple quantum well (MQW) structure including multiple barrier layers and multiple well layers. The first tunnel junction layer 11t includes at least one semiconductor layer among a p-type layer having a p-type impurity concentration higher than that of the first p-type layer 11p and an n-type layer having an n-type impurity concentration higher than that of the second n-type layer 12n.

The first p-side electrode 41p is disposed on the second n-type layer 12n and is electrically connected to the second n-type layer 12n. The first p-side electrode 41p is disposed in contact with, for example, the second n-type layer 12n. The first n-type layer 11n includes an upper surface 11na exposed from the first active layer 11a, the first p-type layer 11p, the first tunnel junction layer 11t, and the second n-type layer 12n. The first n-side electrode 41n is disposed on an upper surface 11na of the second n-type layer 12n, and the first n-side electrode 41n is electrically connected to the first n-type layer.

The first p-side electrode 41p and the first n-side electrode 41n are made of a metal material. As a metal material used for the first p-side electrode 41p and the first n-side electrode 41n, there are exemplified Ti, Ni, Rh, Pt, Al, and the like. For example, the first p-side electrode 41p and the first n-side electrode 41n include a titanium (Ti) film in contact with the first stacked body 10 and a rhodium (Rh) film disposed on the Ti film. The Rh film functions as a reflective film that reflects the light emitted by the first active layer 11a. The light from the first active layer 11a is mainly extracted from the substrate 110 side.

The second stacked body 20 includes a third n-type layer 13n, an active layer 13a disposed on the third n-type layer 13n, a second p-type layer 12p disposed on the active layer 13a, a second tunnel junction layer 12t disposed on the second p-type layer 12p, a fourth n-type layer 14n disposed on the second tunnel junction layer 12t, a second active layer 12a disposed on the fourth n-type layer 14n, a third p-type layer 13p disposed on the second active layer 12a, and a transmissive conductive film 30 disposed on the third p-type layer 13p.

The third n-type layer 13n and the fourth n-type layer 14n contain, for example, Si as n-type impurities. The second p-type layer 12p and the third p-type layer 13p contain, for example, Mg as p-type impurities. The second active layer 12a is a light-emitting layer that emits light and has, for example, an MQW structure including multiple barrier layers and multiple well layers. The number of well layers contained in the second active layer 12a may be smaller than the number of well layers contained in the first active layer 11a. As described later, the active layer 13a is a layer formed at the same time as the first active layer 11a and made of the same material as the first active layer 11a, but a sufficient current is not supplied to the active layer 13a, and the active layer 13a does not function as a light-emitting layer. The second tunnel junction layer 12t includes a semiconductor layer of at least one of a p-type layer having a p-type impurity concentration higher than that of the second p-type layer 12p and an n-type layer having an n-type impurity concentration higher than that of the fourth n-type layer 14n.

The transmissive conductive film 30 has a high translucency with respect to the wavelength of the light emitted by the second active layer 12a. The transmissive conductive film 30 has a translucency of, for example, 70% or more, favorably 80% or more with respect to the wavelength of the light emitted by the second active layer 12a. The transmissive conductive film 30 is, for example, a conductive metal oxide film. As such a conductive metal oxide film, there may be exemplified oxides containing at least one element selected from a group consisting of Zn, In, Sn, Ga, and Ti. For example, the material of the transmissive conductive film 30 is indium tin oxide (ITO) and zinc oxide (ZnO).

The second p-side electrode 42p is disposed on the transmissive conductive film 30 and is electrically connected to the third p-type layer 13p via the transmissive conductive film 30. The second p-side electrode 42p is disposed in contact with, for example, the transmissive conductive film 30. The fourth n-type layer 14n includes an upper surface 14na exposed from the transmissive conductive film 30, the third p-type layer 13p, and the second active layer 12a. The second n-side electrode 42n is disposed on the upper surface 14na of the fourth n-type layer 14n, and the second n-side electrode 42n is electrically connected to the fourth n-type layer 14n.

The second p-side electrode 42p and the second n-side electrode 42n are made of a metal material. As a metal material used for the second p-side electrode 42p and the second n-side electrode 42n, there are exemplified Ti, Ni, Rh, Pt, Al, and the like. For example, the second p-side electrode 42p and the second n-side electrode 42n include a Ti film in contact with the second stacked body 20 and a Rh film disposed on the Ti film. The Rh film functions as a reflective film that reflects the light emitted by the second active layer 12a. The light from the second active layer 12a is mainly extracted from the substrate 110 side.

The emission peak wavelength of the first active layer 11a of the first light-emitting portion 1 is different from the emission peak wavelength of the second active layer 12a of the second light-emitting portion 2. For example, the emission peak wavelength of the first active layer 11a is 430 nm or more and 480 nm or less, so that the first active layer 11a emits blue light. For example, the emission peak wavelength of the second active layer 12a is 500 nm or more and 540 nm or less, so that the second active layer 12a emits green light. It is noted that the emission peak wavelength of the first active layer 11a of the first light-emitting portion 1 may be the same as the emission peak wavelength of the second active layer 12a of the second light-emitting portion 2.

The light-emitting element 100 further includes a first insulating layer 51, a second insulating layer 52, a first p-side wiring 61p, a second p-side wiring 62p, and an n-side wiring 63n.

The first insulating layer 51 covers the side surface of the first stacked body 10, the upper surface of the first stacked body 10, the side surface of the second stacked body 20, and the upper surface of the second stacked body 20. In addition, the first insulating layer 51 covers the main surface 110a of the substrate 110 located on the bottom surface of the groove 80 that separates the first stacked body 10 and the second stacked body 20.

The n-side wiring 63n is disposed on the first insulating layer 51 of the first light-emitting portion 1 and on the first insulating layer 51 of the second light-emitting portion 2. An opening reaching the first n-side electrode 41n is formed in the first insulating layer 51 on the first n-side electrode 41n of the first light-emitting portion 1. The n-side wiring 63n is disposed in the opening of the first insulating layer 51 disposed on the first n-side electrode 41n, and the n-side wiring 63n is electrically connected to the first n-side electrode 41n.

In addition, an opening reaching the second n-side electrode 42n is formed in the first insulating layer 51 on the second n-side electrode 42n of the second light-emitting portion 2. The n-side wiring 63n is disposed in the opening of the first insulating layer 51 disposed on the second n-side electrode 42n, and the n-side wiring 63n is electrically connected to the second n-side electrode 42n.

The second insulating layer 52 is disposed so as to cover the first insulating layer 51 and the n-side wiring 63n. The first p-side wiring 61p is disposed on the second insulating layer 52 of the first light-emitting portion 1. An opening reaching the first p-side electrode 41p is formed in the first insulating layer 51 and the second insulating layer 52 on the first p-side electrode 41p of the first light-emitting portion 1. The first p-side wiring 61p is provided in the opening of the first insulating layer 51 and the second insulating layer 52 disposed on the first p-side electrode 41p, and the first p-side wiring 61p is electrically connected to the first p-side electrode 41p.

The second p-side wiring 62p is disposed on the second insulating layer 52 of the second light-emitting portion 2. An opening reaching the second p-side electrode 42p is formed in the first insulating layer 51 and the second insulating layer 52 on the second p-side electrode 42p of the second light-emitting portion 2. The second p-side wiring 62p is provided in the opening of the first insulating layer 51 and the second insulating layer 52 disposed on the second p-side electrode 42p, and the second p-side wiring 62p is electrically connected to the second p-side electrode 42p.

As shown in FIG. 1, in a region outside the region where the multiple first light-emitting portions 1 and the multiple second light-emitting portions 2 are disposed on the main surface 110a of the substrate 110, a first p-side pads 71p, a second p-side pads 72p, and an n-side pads 73n are disposed.

The first p-side pad 71p is electrically connected to the first p-side wiring 61p. The second p-side pad 72p is electrically connected to the second p-side wiring 62p. The n-side pad 73n is electrically connected to the n-side wiring 63n.

The n-side wiring 63n is continuously provided on the multiple first light-emitting portions 1 and the multiple second light-emitting portions 2 aligned in the first direction X. The n-side wiring 63n is connected to the first n-side electrodes 41n of the multiple first light-emitting portions 1 aligned in the first direction X and the second n-side electrodes 42n of the multiple second light-emitting portions 2 aligned in the first direction X, respectively.

The first p-side wiring 61p is continuously provided on the multiple first light-emitting portions 1 aligned in the second direction Y. The first p-side wiring 61p is connected to the first p-side electrodes 41p of each of the multiple first light-emitting portions 1 aligned in the second direction Y.

The second p-side wiring 62p is continuously provided on the multiple second light-emitting portions 2 aligned in the second direction Y. The second p-side wiring 62p is connected to the second p-side electrodes 42p of each of the multiple second light-emitting portions 2 aligned in the second direction Y.

The light-emitting element 100 is mounted on a wiring board. Multiple wiring portions are disposed on the wiring board. The light-emitting element 100 has the main surface 110a of the substrate 110 facing the mounting surface of the wiring board and is mounted on the wiring board by so-called flip chip mounting. The first p-side pad 71p, the second p-side pad 72p, and the n-side pad 73n are electrically connected to the wiring portions disposed on the wiring board via conductive bonding members. After mounting the light-emitting element 100 on the wiring board, a light-reflecting member may be disposed to cover the light-emitting element 100. The light-reflecting member is also disposed between the light-emitting element 100 and the mounting substrate. As the light-reflecting member, for example, a resin including a light-reflecting member is used. As the resin, a silicone resin, an epoxy resin, an acrylic resin or the like can be used. As the light-reflecting member, titanium oxide, silicon oxide, aluminum oxide or the like can be used.

When a positive potential is applied to the first p-side pad 71p and a potential lower than the potential applied to the first p-side pad 71p is applied to the n-side pad 73n, a forward voltage is applied to the first active layer 11a of the first light-emitting portion 1, so that the first active layer 11a emits light. The light from the first active layer 11a is extracted from a light extraction surface 110b side, which is the surface opposite to the main surface 110a of the substrate 110, to the outside of the light-emitting element 100. The current flows from the first p-side electrode 41p to the first n-side electrode 41n via the second n-type layer 12n, the first tunnel junction layer 11t, the first p-type layer 11p, the first active layer 11a, and the first n-type layer 11n.

When a positive potential is applied to the first p-side pad 71p and a potential lower than the potential applied to the first p-side pad 71p is applied to the n-side pad 73n, a reverse voltage is applied to the tunnel junction (p-n junction) in the first tunnel junction layer 11t. For this reason, due to the tunnel effect, a current flows in the first tunnel junction layer 11t. That is, a current is allowed to flow in the first tunnel junction layer 11t by tunneling the electrons existing in the valence band to the conduction band.

When a positive potential is applied to the second p-side pad 72p and a potential lower than the potential applied to the second p-side pad 72p is applied to the n-side pad 73n, a forward voltage is applied to the second active layer 12a of the second light-emitting portion 2, so that the second active layer 12a emits light. The light from the second active layer 12a is extracted from the light extraction surface 110b side of the substrate 110 to the outside of the light-emitting element 100. No electrode is disposed on the third n-type layer 13n. A current flows from the second p-side electrode 42p to the second n-side electrode 42n via the transmissive conductive film 30, the third p-type layer 13p, the second active layer 12a, and the fourth n-type layer 14n. No current is substantially supplied to the active layer 13a disposed on the third n-type layer 13n, and the active layer 13a does not contribute to the light emission of the second light-emitting portion 2.

By applying a forward potential between the first p-side pad 71p and the n-side pad 73n and applying no potential to the second p-side pad 72p, the first light-emitting portion 1 is allowed to emit light, and the second light-emitting portion 2 is not allowed to emit light. By applying a forward potential between the second p-side pad 72p and the n-side pad 73n and applying no potential to the first p-side pad 71p, the second light-emitting portion 2 is allowed to emit light, and the first light-emitting portion 1 is not allowed to emit light.

The first light-emitting portion 1 and the second light-emitting portion 2 emit light having respective different wavelengths. For example, the first light-emitting portion 1 emits the blue light, and the second light-emitting portion 2 emits the green light. According to the embodiment, individual lighting control of only the emission of the blue light by the first light-emitting portion 1 or only the emission of the green light by the second light-emitting portion 2 can be performed.

In addition, by applying a predetermined potential to the first p-side pad 71p, the second p-side pad 72p, and the n-side pad 73n, both the first light-emitting portion 1 and the second light-emitting portion 2 can be allowed to emit light, and the light-emitting element 100 is allowed to emit light in which, for example, the blue light and the green light are mixed. In addition, by controlling a current value supplied to each of the first light-emitting portion 1 and the second light-emitting portion 2 and an on/off duty ratio, a chromaticity of light obtained by the light emission of the first light-emitting portion 1 and the light emission of the second light-emitting portion 2 can be adjusted.

In addition, the multiple first light-emitting portions 1 are divided into multiple groups, and the first p-side pad 71p is connected to each group. The multiple second light-emitting portions 2 are divided into multiple groups, and the second p-side pad 72p is connected to each group. In the example of FIG. 1, the multiple first light-emitting portions 1 arranged in the second direction Y belong to the same group and are connected to the same first p-side pad 71p. In addition, the multiple second light-emitting portions 2 aligned in the second direction Y belong to the same group and are connected to the same second p-side pad 72p. Therefore, it is possible to control the lighting and non-lighting of the first light-emitting portion 1 and the second light-emitting portion 2 for each group, that is, for each region.

The transmissive conductive film 30 in contact with the second p-side electrode 42p in the second light-emitting portion 2 functions as a current diffusion layer that allows the current from the second p-side electrode 42p to be diffused in the plane direction of the second stacked body 20. The second n-type layer 12n in contact with the first p-side electrode 41p in the first light-emitting portion 1 functions as a current diffusion layer that allows the current from the first p-side electrode 41p to be diffused in the plane direction of the first stacked body 10.

The resistivity of the second n-type layer 12n is higher than that of the transmissive conductive film 30. For example, the resistivity of the second n-type layer 12n is 10 times or more the resistivity of the transmissive conductive film 30. For this reason, the thickness of the second n-type layer 12n is allowed to be larger than the thickness of the transmissive conductive film 30. Accordingly, the current from the first p-side electrode 41p can be allowed to be easily diffused in the plane direction of the first stacked body 10 by the second n-type layer 12n. As a result, the forward voltage during the controlling of the lighting of the light-emitting element 100 can be reduced. The resistivity of the transmissive conductive film 30 is, for example, $1\times10^{-6}$ Ωm or more and $5\times10^{-6}$ Ωm or less. The resistivity of the second n-type layer 12n is, for example, $1\times10^{-5}$ Ωm or more and $5\times10^{-4}$ Ωm or less. The thickness of the transmissive conductive film 30 is, for example, 30 nm or more and 60 nm or less. The thickness of the second n-type layer 12n is, for example, 80 nm or more and 700 nm or less, favorably 80 nm or more and 500 nm or less.

In the first light-emitting portion 1, the first tunnel junction layer 11t can also function as the current diffusion layer. However, when the thickness of the first tunnel junction layer 11t is increased, the forward voltage applied to the first light-emitting portion 1 is increased. In the embodiment, the second n-type layer 12n disposed on the first tunnel junction layer 11t is used as the current diffusion layer. It is favorable that the thickness of the second n-type layer 12n is larger than the thickness of the first tunnel junction layer 11t.

The first n-type layer 11n of the first stacked body 10 and the third n-type layer 13n of the second stacked body 20 are allowed to be separated from each other by the groove 80, so that it is possible to suppress the light from the first active layer 11a of the first stacked body 10 and the light from the second active layer 12a of the second stacked body 20 from propagating through the first n-type layer 11n and the third n-type layer 13n. Accordingly, when lighting of the first light-emitting portion 1 and lighting of the second light-emitting portion 2 are individually controlled, the propagation of the light from the lighting site to the adjacent light-emitting unit is reduced, and thus, the desired wavelength of light can be extracted from the lighting site.

Next, a method for manufacturing the light-emitting element 100 according to the embodiment of the present disclosure will be described with reference to FIG. 3 to FIG. 11.

Figure 3:
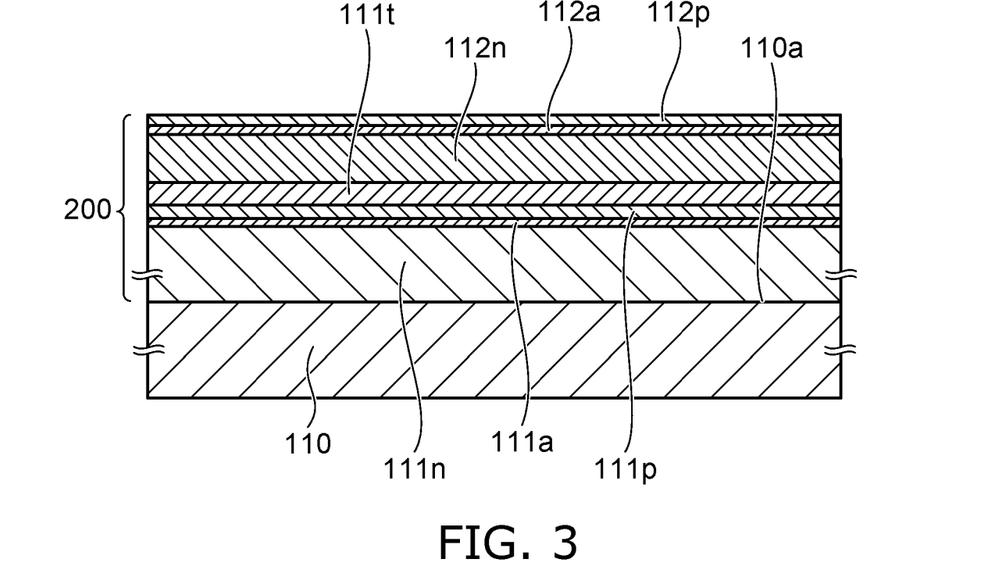
FIG. 3 to FIG. 11 are schematic cross-sectional views showing a method for manufacturing a light-emitting element according to an embodiment of the present disclosure.

First, as shown in FIG. 3, a semiconductor stacked body 200 disposed on the substrate 110 is prepared. The semiconductor stacked body 200 is configured with a nitride semiconductor layer including a first n-type layer 111n disposed on the substrate 110, a first active layer 111a disposed on the first n-type layer 111n, a first p-type layer 111p disposed on the first active layer 111a, a tunnel junction layer 111t disposed on the first p-type layer 111p, a second n-type layer 112n disposed on the tunnel junction layer 111t, a second active layer 112a disposed on the second n-type layer 112n, and a second p-type layer 112p disposed on the second active layer 112a.

For example, the substrate 110 is a sapphire substrate. The semiconductor stacked body 200 containing a nitride semiconductor is grown on the substrate 110 by a metal organic chemical vapor deposition (MOCVD) method. The first n-type layer 111n, the first active layer 111a, the first p-type layer 111p, the tunnel junction layer 111t, the second n-type layer 112n, the second active layer 112a, and the second p-type layer 112p are grown on the substrate 110 in this order. Alternatively, a purchased semiconductor stacked body 200 may be prepared.

In addition, with respect to the semiconductor stacked body 200, there are prepared a first wafer on which the first n-type layer 111n, the first active layer 111a, the first p-type layer 111p, and the tunnel junction layer 111t are formed in this order on the substrate 110 and a second wafer on which the second p-type layer 112p, the second active layer 112a, and the second n-type layer 112n are formed in this order on another substrate. Then, a semiconductor stacked body formed by bonding the tunnel junction layer 111t of the first wafer and the second n-type layer 112n of the second wafer may be prepared. The tunnel junction layer 111t on the first wafer and the second n-type layer 112n on the second wafer are bonded. After bonding the first wafer and the second wafer, the substrate of the second wafer is removed.

Figure 4:
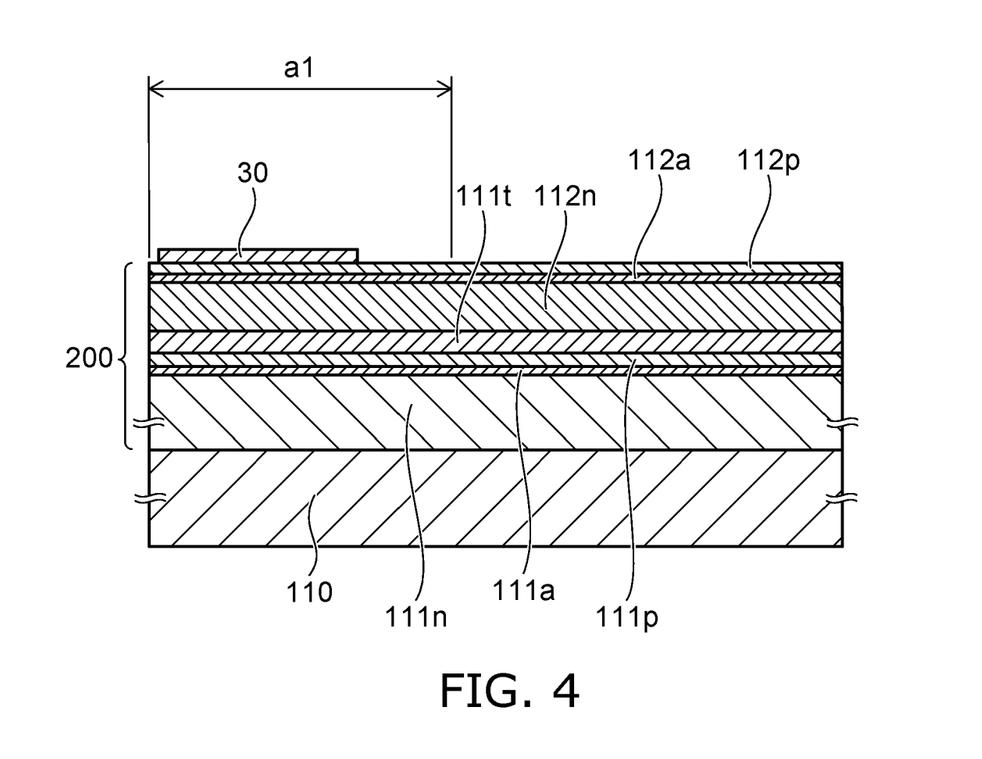

As shown in FIG. 4, the transmissive conductive film 30 having a resistivity lower than that of the second n-type layer 112n is formed on a portion of the second p-type layer 112p in a first region a1 of the semiconductor stacked body 200. The first region a1 of the semiconductor stacked body 200 is a region in which the second light-emitting portion 2 is formed. The transmissive conductive film 30 is allowed to remain on a portion of the first region a1 by being formed on the entire surface of the second p-type layer 112p and, after that, being partially removed by dry etching using, for example, a resist mask. For example, in the transmissive conductive film 30 formed on the entire surface of the second p-type layer 112p, the transmissive conductive film 30 is etched in a state in which the resist mask is formed on the surface of the transmissive conductive film 30 formed on a portion of the first region a1. After that, by removing the resist mask, the transmissive conductive film 30 is formed in a portion of the first region a1. For dry etching of the transmissive conductive film 30, for example, a reactive ion etching (RIE) method is used. It is noted that the wet etching may be used to remove the transmissive conductive film 30.

Figure 5:
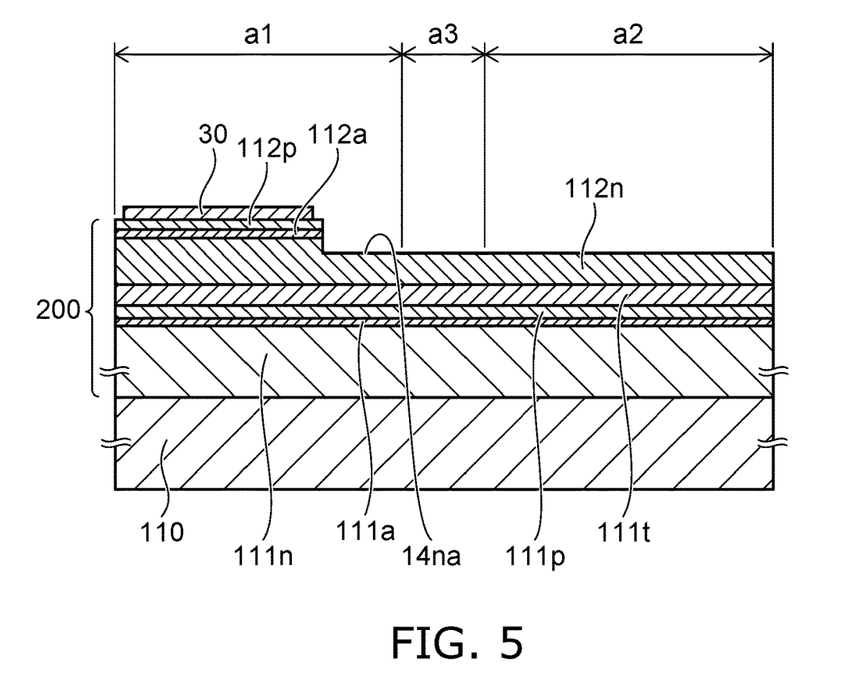

After forming the transmissive conductive film 30 in the first region a1, as shown in FIG. 5, the second p-type layer 112p and the second active layer 112a in a second region a2 of the semiconductor stacked body 200 are removed. The second p-type layer 112p and the second active layer 112a are removed by, for example, dry etching using the resist mask. The second region a2 of the semiconductor stacked body 200 is a region in which the first light-emitting portion 1 is formed. In addition, when removing the second p-type layer 112p and the second active layer 112a in the second region a2 of the semiconductor stacked body 200, the second p-type layer 112p and the second active layer 112a in a third region a3 located between the first region a1 and the second region a2 are also removed. Furthermore, a portion of the second p-type layer 112p and a portion of the second active layer 112a adjacent to the third region a3 in the first region a1 are also removed. For example, an RIE method is used for dry etching of the second p-type layer 112p and the second active layer 112a.

As shown in FIG. 5, the upper surface of the second n-type layer 112n is exposed in the first region a1, the second region a2, and the third region a3 from which the second p-type layer 112p and the second active layer 112a are removed. The second n-type layer 112n thicker than the transmissive conductive film 30 is allowed to remain in the uppermost layers of the second region a2 and the third region a3. In addition, in the first region a1, the upper surface 14na of the second n-type layer 112n exposed by removing the second p-type layer 112p and the second active layer 112a becomes a surface where the second n-side electrode 42n in the second light-emitting portion 2 described above is disposed.

The second n-type layer 112n remaining after the removal in the second region a2 becomes the second n-type layer 12n functioning as the current diffusion layer of the first light-emitting portion 1 described above. Therefore, it is required to control the removal of the second n-type layer 112n so that the second n-type layer 112n having a certain thickness remains in the second region a2. In a case in which the thickness of the second n-type layer 112n before the removal is small, it is difficult to control the removal of the second n-type layer 112n so as to leave the second n-type layer 112n having a predetermined thickness or more. On the other hand, as the thickness of the second n-type layer 112n becomes large, the time for growing the second n-type layer 112n becomes long, and thus, there is a concern that heat damage may be applied to the tunnel junction layer 111t and the first active layer 111a formed below the second n-type layer 112n.

For this reason, it is necessary to set the thickness of the second n-type layer 112n in consideration of the controllability during removing the second n-type layer 112n and the heat damage to the layer formed below the second n-type layer 112n. In the embodiment, the thickness of the second n-type layer 112n before removal is set to, for example, 1 µm, and about 500 nm, which is about half the thickness of the 1 µm second n-type layer 112n, is removed. Therefore, the second n-type layer 112n having a thickness of about 500 nm allowed to remain in the second region a2.

Figure 6:
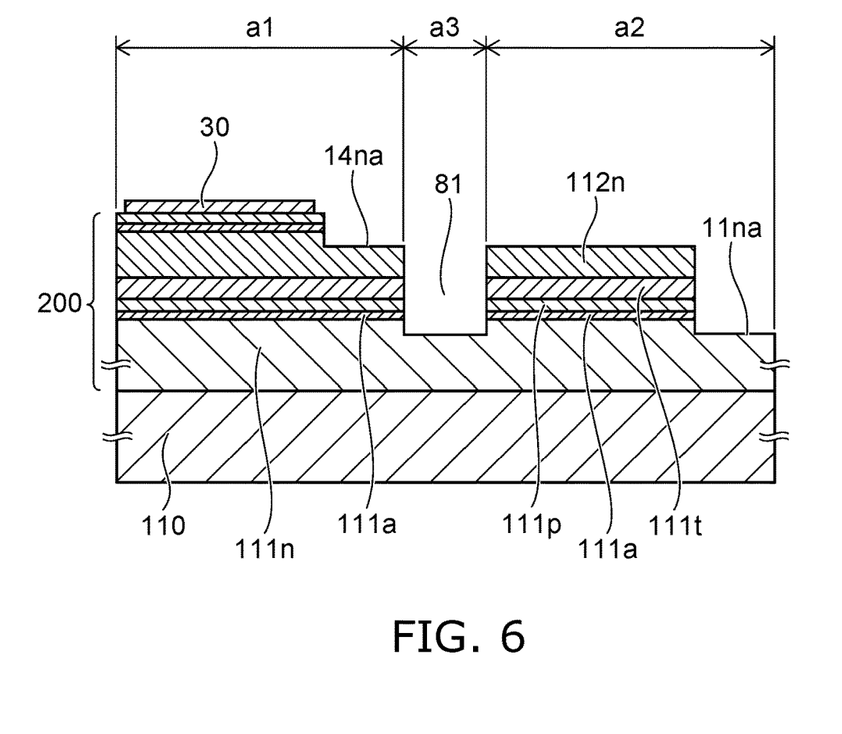

After the process shown in FIG. 5, as shown in FIG. 6, a portion of the second n-type layer 112n, a portion of the tunnel junction layer 111t, a portion of the first p-type layer 111p, and a portion of the first active layer 111a in the second region a2 are removed. A portion of the second n-type layer 112n, a portion of the tunnel junction layer 111t, a portion of the first p-type layer 111p, and a portion of the first active layer 111a in the second region a2 are removed, for example, by dry-etching using the resist mask. Accordingly, the upper surface 11na of the first n-type layer 111n in the second region a2 is exposed from the semiconductor stacked body 200. The upper surface 11na of the first n-type layer 111n becomes a surface on which the first n-side electrode 41n in the first light-emitting portion 1 described above is disposed. For example, the RIE method is used for dry etching of a portion of the second n-type layer 112n, a portion of the tunnel junction layer 111t, a portion of the first p-type layer 111p, and a portion of the first active layer 111a in the second region a2.

In addition, at the same time as the process of exposing the upper surface 11na of the first n-type layer 111n in the second region a2, the second n-type layer 112n, the tunnel junction layer 111t, the first p-type layer 111p, and the first active layer 111a are removed in the third region a3 located between the first region a1 and the second region a2. Accordingly, a first groove portion 81 reaching the first n-type layer 111n is formed in the third region a3. The second n-type layer 112n, the tunnel junction layer 111t, the first p-type layer 111p, and the first active layer 111a in the third region a3 are removed by, for example, dry etching using the resist mask. For example, the RIE method is used for dry etching of the second n-type layer 112n, the tunnel junction layer 111t, the first p-type layer 111p, and the first active layer 111a in the third region a3.

Figure 7:
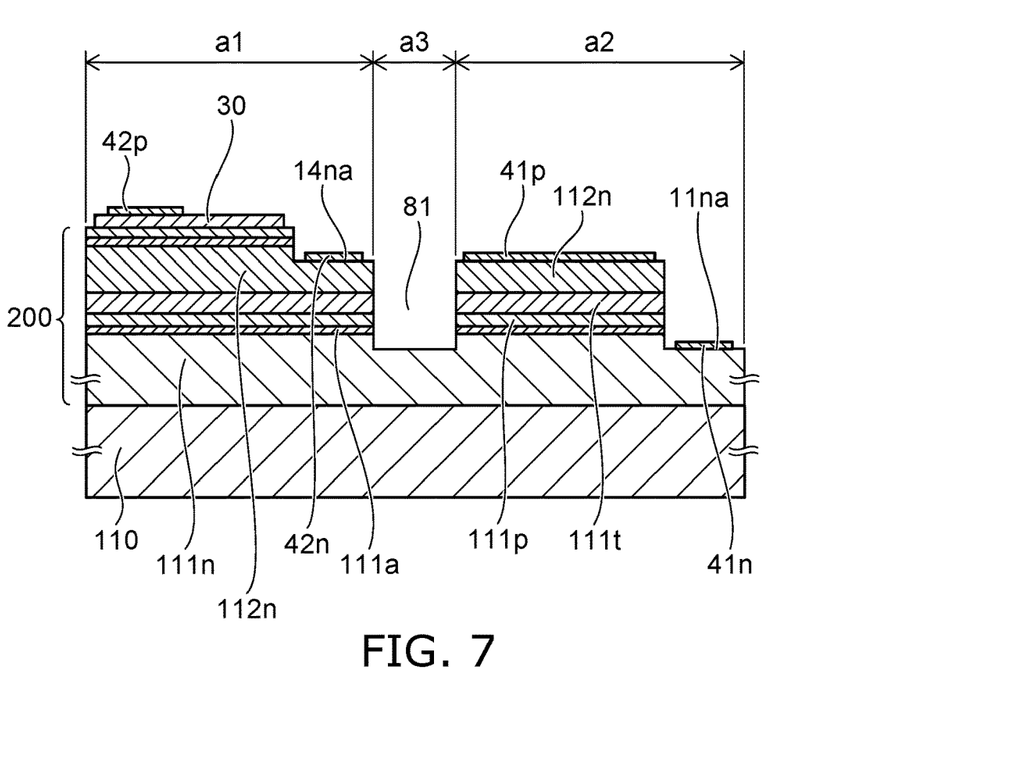

After the process shown in FIG. 6, as shown in FIG. 7, electrodes are formed on the upper surface of the transmissive conductive film 30, the upper surface 14na of the second n-type layer 112n in the first region a1, the upper surface of the second n-type layer 112n in the second region a2, and the upper surface 11na of the first n-type layer 111n in the second region a2.

As shown in FIG. 7, the second p-side electrode 42p is formed on the upper surface of the transmissive conductive film 30. The second n-side electrode 42n is formed on the upper surface 14na of the second n-type layer 112n in the first region a1. The first p-side electrode 41p is formed on the upper surface of the second n-type layer 112n in the second region a2. The first n-side electrode 41n is formed on the upper surface 11na of the first n-type layer 111n in the second region a2.

For example, a metal film is formed by a sputtering method in a state in which a mask for covering the region where the first p-side electrode 41p, the first n-side electrode 41n, the second p-side electrode 42p, and the second n-side electrode 42n are not formed and exposing the region where and the first p-side electrode 41p, the first n-side electrode 41n, the second p-side electrode 42p, and the second n-side electrode 42n are formed on the surface of the semiconductor stacked body 200. After that, the metal film deposited on the mask is removed together with the mask by removing the mask, and the metal film is allowed to remain in the region exposed from the mask as the first p-side electrode 41p, the first n-side electrode 41n, the second p-side electrode 42p, and the second n-side electrode 42n.

Figure 8:
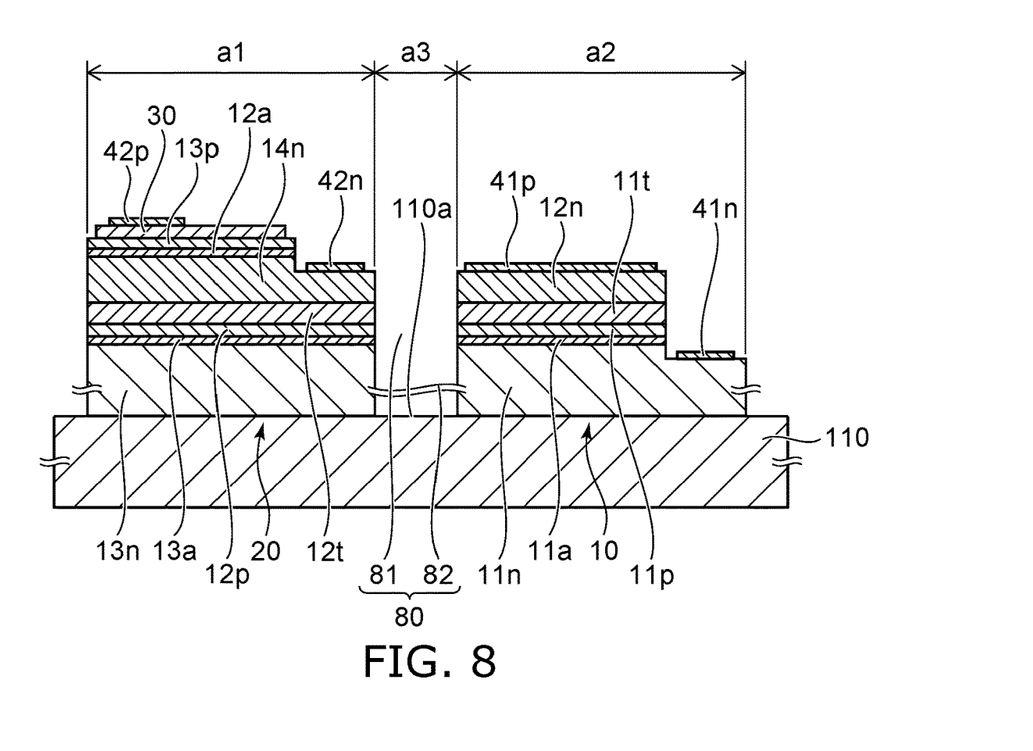

After forming the first p-side electrode 41p, the first n-side electrode 41n, the second p-side electrode 42p, and the second n-side electrode 42n, as shown in FIG. 8, a second groove portion 82 reaching the substrate 110 is formed below the first groove portion 81. The first groove portion 81 and the second groove portion 82 are connected in the thickness direction of the semiconductor stacked body 200, and separate the semiconductor stacked body 200 into the first stacked body 10 and the second stacked body 20 on the substrate 110 to form the groove 80 reaching the substrate 110. The process of forming the groove 80 includes a process of forming the first groove portion 81 and a process of forming the second groove portion 82. The depth of the first groove portion 81 is, for example, 1 μm or more and 4 μm or less. The depth of the second groove portion 82 is, for example, 6 μm or more and 10 μm or less.

As shown in FIG. 1, when viewed from the top, the groove 80 is formed in a grid pattern along the first direction X and the second direction Y. In the first direction X, the grooves 80 are located between the adjacent first stacked bodies 10 and between the adjacent second stacked bodies 20. In addition, in the second direction Y, the grooves 80 are located between the first stacked body 10 and the second stacked body 20. Due to the grooves 80, the semiconductor stacked body 200 is separated into multiple first stacked bodies 10 and multiple second stacked bodies 20 on the substrate 110. As shown in FIG. 8, the side surfaces of the first stacked body 10 adjacent to the grooves 80 have the same surface level. For example, the side surface of the second n-type layer 12n, the side surface of the first tunnel junction layer 11t, the side surface of the first p-type layer 11p, the side surface of the first active layer 11a, and the side surface of the first n-type layer 11n have the same surface level. As shown in FIG. 8, the side surfaces of the second stacked body 20 adjacent to the groove 80 have the same surface level. For example, the side surface of the fourth n-type layer 14n, the side surface of the second tunnel junction layer 12t, the side surface of the second p-type layer 12p, the side surface of the active layer 13a, and the side surface of the third n-type layer 13n formed in the process of forming the groove 80 have the same surface level. Herein, the fact that one surface and the other surface have the same surface level includes a case in which one surface is inclined by about 1 degree with respect to the other surface.

By forming the grooves 80, the first n-type layer 111n, the first active layer 111a, the first p-type layer 111p, the tunnel junction layer 111t, and the second n-type layer 112n are separated into multiple portions. By performing the process of forming the groove 80, The first n-type layer 111n is separated into the first n-type layer 11n of the first stacked body 10 and the third n-type layer 13n of the second stacked body 20. The first active layer 111a is separated into the first active layer 11a of the first stacked body 10 and the active layer 13a of the second stacked body 20. The first p-type layer 111p is separated into the first p-type layer 11p of the first stacked body 10 and the second p-type layer 12p of the second stacked body 20. The tunnel junction layer 111t is separated into the first tunnel junction layer 11t of the first stacked body 10 and the second tunnel junction layer 12t of the second stacked body 20. The second n-type layer 112n is separated into the second n-type layer 12n of the first stacked body 10 and the fourth n-type layer 14n of the second stacked body 20.

After the process shown in FIG. 6, it is considered that the transmissive conductive film is also allowed to be formed on the stacked body of the second region a2 in which the first light-emitting portion 1 is formed, but the semiconductor stacked body 200 has a step difference portion due to the first groove portion 81 and the like, so that it is difficult to form the transmissive conductive film in the second region a2. For this reason, in the embodiment, the second n-type layer 112n is allowed to remain in the second region a2, and thus, the second n-type layer 112n (corresponding to the second n-type layer 12n in FIG. 2) is used as the current diffusion layer on the first p-side electrode 41p side in the first light-emitting portion 1.

In the process of exposing the upper surface 11na of the first n-type layer 111n in the second region a2 shown in FIG. 6, the first groove portion 81 is not formed, and after the first p-side electrode 41p, the first n-side electrode 41n, the second p-side electrode 42p, and the second n-side electrode 42n are formed, the groove 80 reaching the substrate 110 can also be formed in the third region a3 in the process shown in FIG. 8.

The thickness of the first n-type layer 111n is several times larger than the total thickness of the first active layer 111a, the first p-type layer 111p, the tunnel junction layer 111t, and the second n-type layer 112n. The thickness of the first n-type layer 111n is 3 times or more and 10 times or less the total thickness of the first active layer 111a, the first p-type layer 111p, the tunnel junction layer 111t, and the second n-type layer 112n. For this reason, in the process shown in FIG. 6, during the process of exposing the upper surface 11na of the first n-type layer 111n in the second region a2, the first n-type layer 111n is also removed to some extent by forming the first groove portion 81 in the third region a3. Accordingly, in the process shown in FIG. 8, the amount of removal of the first n-type layer 111n during the etching for separating the first n-type layer 111n, that is, the time required for removing the first n-type layer 111n can be reduced, so that it is possible to obtain an efficient process.

Figure 9:
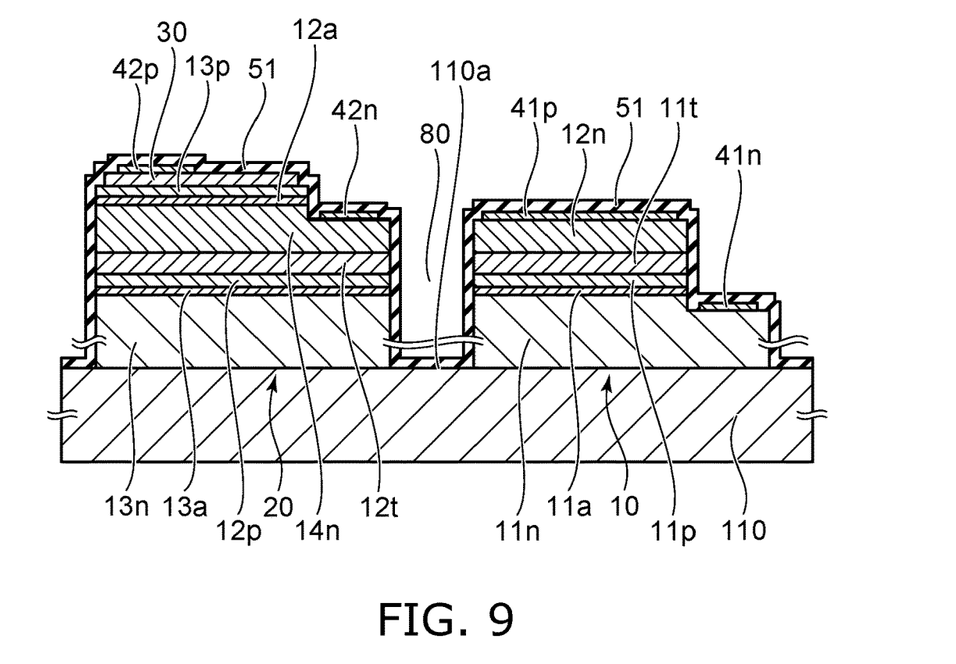

After forming the groove 80, as shown in FIG. 9, the first insulating layer 51 covering the upper surface of the first stacked body 10, the side surface of the first stacked body 10, the upper surface of the second stacked body 20, and the side surface of the second stacked body 20 is formed. The first insulating layer 51 is also formed on the main surface 110a of the substrate 110 located on the bottom surface of the groove 80.

Figure 10:
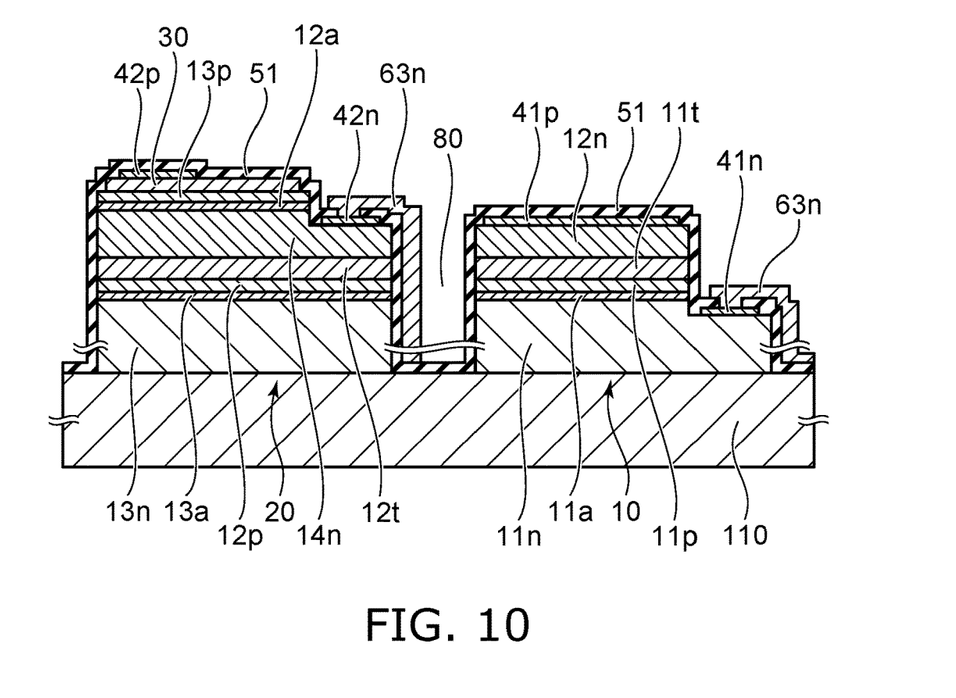

After forming the first insulating layer 51, openings are formed in the first insulating layer 51 on the first n-side electrode 41n of the first stacked body 10 and the first insulating layer 51 on the second n-side electrode 42n of the second stacked body 20, respectively. Then, as shown in FIG. 10, the n-side wiring 63n connected to each of the first n-side electrode 41n and the second n-side electrode 42n is formed in the opening of the first insulating layer 51. The n-side wiring 63n extends on the first insulating layer 51 in the first direction X shown in FIG. 1 and are connected to the first n-side electrodes 41n of the multiple first stacked bodies 10 and the second n-side electrodes 42n of the multiple second stacked bodies 20 arranged in the first direction X.

Figure 11:
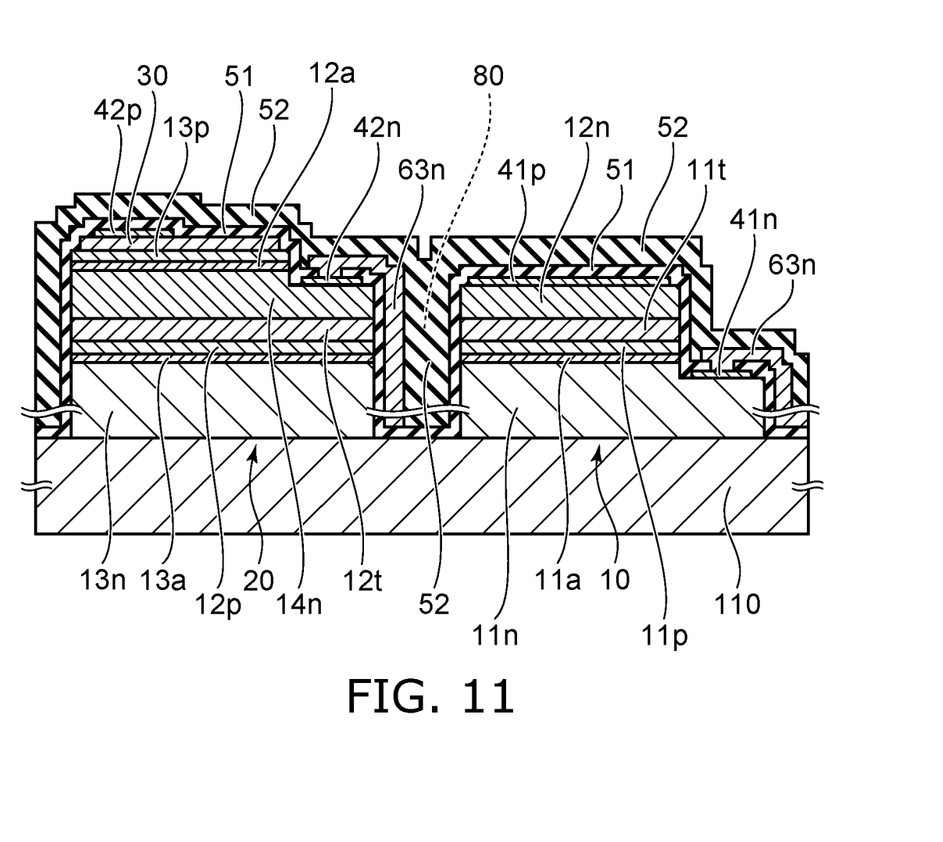

After forming the n-side wiring 63n, as shown in FIG. 11, the second insulating layer 52 is formed so as to cover the first insulating layer 51 and the n-side wiring 63n. The first insulating layer 51, the n-side wiring 63n, and the second insulating layer 52 are formed in the groove 80.

After forming the second insulating layer 52, as shown in FIG. 2, the opening reaching the first p-side electrode 41p is formed in the second insulating layer 52 and the first insulating layer 51 on the first p-side electrode 41p of the first stacked body 10. The first p-side wiring 61p connected to the first p-side electrode 41p is formed in the opening. In addition, the opening reaching the second p-side electrode 42p is formed in the second insulating layer 52 and the first insulating layer 51 on the second p-side electrode 42p of the second stacked body 20. The second p-side wiring 62p connected to the second p-side electrode 42p is formed in the opening.

The first p-side wiring 61p extends on the second insulating layer 52 in the second direction Y shown in FIG. 1 and is connected to the first p-side electrodes 41p of the multiple first stacked bodies 10 arranged in the second direction Y. The second p-side wiring 62p extends on the second insulating layer 52 in the second direction Y shown in FIG. 1 and is connected to the second p-side electrodes 42p of the multiple second stacked bodies 20 arranged in the second direction Y.

The tunnel junction layer 111t is not limited to the MOCVD method and may be formed by a molecular beam epitaxy (MBE) method. In comparison with the tunnel junction layer 111t formed by the MOCVD method, the tunnel junction layer 111t formed by the MBE method is likely to have an improved crystallinity, and the forward voltage during the light emission of the first light-emitting portion 1 can be reduced.

The substrate 110 can be removed from the semiconductor stacked body 200. In addition, the surface of the first n-type layer 111n exposed by removing the substrate 110 can be roughened. Accordingly, it is possible to improve the light extraction efficiency from the roughened surface of the first n-type layer 11n of the first light-emitting portion 1 and the roughened surface of the third n-type layer 13n of the second light-emitting portion 2.

When the substrate 110 is removed, the semiconductor stacked body 200 and/or the insulating layer is also disposed outside the region where the first light-emitting portion 1 and the second light-emitting portion 2 are arranged in FIG. 1, and the first p-side pad 71p, the second p-side pad 72p, and the n-side pad 73n can be arranged on the semiconductor stacked body 200 and/or the insulating layer.

The light-emitting element according to the embodiment can be used as a backlight light source for a liquid crystal display, various lighting devices, or a light source for a light-emitting device used for a display or the like. In particular, it is favorable that a light-emitting device in which the first light-emitting portion 1 is a light-emitting unit that emits the blue light and the second light-emitting portion 2 is a light-emitting unit that emits the green light is used as a light-emitting device for a direct type or edge type backlight light source, so that color gamut can be widened.

When the light-emitting element according to the embodiment of the present disclosure is used as a light source of a light-emitting device, a wavelength conversion member can be arranged for each region including the first light-emitting portion 1 and the second light-emitting portion 2. The wavelength conversion member is arranged on the surface side of the substrate 110 facing the surface on which the first light-emitting portion 1 and the second light-emitting portion 2 are arranged. As the wavelength conversion member, for example, a resin or glass containing a phosphor can be used. In addition, optical members such as a light diffusion sheet, a prism sheet, and a light guide plate can be further disposed on the surface side of the substrate 110 facing the surface on which the first light-emitting portion 1 and the second light-emitting portion 2 are arranged.

Embodiments of the present invention have been described with reference to specific examples. However, the present invention is not limited to these specific examples. Based on the above-described embodiments of the present invention, all embodiments that can be implemented with appropriate design modification by one skilled in the art are also within the scope of the present invention as long as the gist of the present invention is included. Further, within the scope of the spirit of the present invention, one skilled in the art can conceive various modifications that fall within the scope of the present invention.

What is claimed is:

1. A light-emitting element comprising:
   a first light-emitting portion comprising:
      a first stacked body made of a nitride semiconductor,
      a first p-side electrode, and
      a first n-side electrode; and
   a second light-emitting portion comprising:
      a second stacked body made of a nitride semiconductor,
      a second p-side electrode, and
      a second n-side electrode; wherein:
   the first stacked body comprises:
      a first n-type layer,
      a first active layer disposed on the first n-type layer,
      a first p-type layer disposed on the first active layer,
      a first tunnel junction layer disposed on the first p-type layer, and
      a second n-type layer disposed on the first tunnel junction layer;
   the first p-side electrode is disposed on the second n-type layer and is electrically connected to the second n-type layer,
   the first n-side electrode is disposed on the first n-type layer and is electrically connected to the first n-type layer,
   the second stacked body comprises:
      a third n-type layer,
      a second p-type layer disposed on the third n-type layer,
      a second tunnel junction layer disposed on the second p-type layer,
      a fourth n-type layer disposed on the second tunnel junction layer,
      a second active layer disposed on the fourth n-type layer, a third p-type layer disposed on the second active layer, and a transmissive conductive film disposed on the third p-type layer;

the second p-side electrode is disposed on the transmissive conductive film and is electrically connected to the third p-type layer;

the second n-side electrode is disposed on the fourth n-type layer and is electrically connected to the fourth n-type layer;

a resistivity of the second n-type layer is higher than a resistivity of the transmissive conductive film; and a thickness of the second n-type layer is larger than a thickness of the transmissive conductive film.

2. The light-emitting element according to claim 1, wherein:

an emission peak wavelength of the first active layer of the first light-emitting portion is different from an emission peak wavelength of the second active layer of the second light-emitting portion.

3. The light-emitting element according to claim 1, wherein:

a thickness of the second n-type layer is larger than a thickness of the first tunnel junction layer.

4. The light-emitting element according to claim 2, wherein:

a thickness of the second n-type layer is larger than a thickness of the first tunnel junction layer.

5. The light-emitting element according to claim 1, wherein:

a thickness of the second n-type layer is 80 nm or more and 700 nm or less.

6. The light-emitting element according to claim 2, wherein:

a thickness of the second n-type layer is 80 nm or more and 700 nm or less.

7. The light-emitting element according to claim 3, wherein:

a thickness of the second n-type layer is 80 nm or more and 700 nm or less.

8. The light-emitting element according to claim 1, wherein:

the first stacked body and the second stacked body are disposed separately from each other on one substrate.

9. The light-emitting element according to claim 2, wherein:

the first stacked body and the second stacked body are disposed separately from each other on one substrate.

10. The light-emitting element according to claim 3, wherein:

the first stacked body and the second stacked body are disposed separately from each other on one substrate.

11. The light-emitting element according to claim 1, further comprising:

a first p-side wiring disposed on the first light-emitting portion and connected to the first p-side electrode;

a second p-side wiring disposed on the second light-emitting portion and connected to the second p-side electrode; and an n-side wiring disposed continuously on the first light-emitting portion and the second light-emitting portion, and connected to the first n-side electrode and the second n-side electrode.

12. The light-emitting element according to claim 2, further comprising:

a first p-side wiring disposed on the first light-emitting portion and connected to the first p-side electrode;

a second p-side wiring disposed on the second light-emitting portion and connected to the second p-side electrode; and an n-side wiring disposed continuously on the first light-emitting portion and the second light-emitting portion, and connected to the first n-side electrode and the second n-side electrode.

13. The light-emitting element according to claim 3, further comprising:

a first p-side wiring disposed on the first light-emitting portion and connected to the first p-side electrode;

a second p-side wiring disposed on the second light-emitting portion and connected to the second p-side electrode; and an n-side wiring disposed continuously on the first light-emitting portion and the second light-emitting portion, and connected to the first n-side electrode and the second n-side electrode.

14. A method for manufacturing a light-emitting element, the method comprising:

providing a semiconductor stacked body made of a nitride semiconductor, the semiconductor stacked body comprising:

a first n-type layer disposed on a substrate, a first active layer disposed on the first n-type layer, a first p-type layer disposed on the first active layer, a tunnel junction layer disposed on the first p-type layer, a second n-type layer disposed on the tunnel junction layer, a second active layer disposed on the second n-type layer, and a second p-type layer disposed on the second active layer;

forming a transmissive conductive film having a resistivity lower than a resistivity of the second n-type layer on the second p-type layer in a first region of the semiconductor stacked body;

removing the second p-type layer and the second active layer in a second region of the semiconductor stacked body to expose an upper surface of the second n-type layer in the first region and allow the second n-type layer having a thickness larger than a thickness of the transmissive conductive film to remain on an uppermost layer in the second region;

removing a portion of the second n-type layer, a portion of the tunnel junction layer, a portion of the first p-type layer, and a portion of the first active layer in the second region and exposing an upper surface of the first n-type layer in the second region from the semiconductor stacked body; and forming electrodes on an upper surface of the transmissive conductive film, the upper surface of the second n-type layer in the first region, an upper surface of the second n-type layer in the second region, and the upper surface of the first n-type layer.

15. The method according to claim 14, further comprising:

forming a groove reaching the substrate in the semiconductor stacked body by removing the second n-type layer, the tunnel junction layer, the first p-type layer, the first active layer, and the first n-type layer in a third region located between the first region and the second region of the semiconductor stacked body.

16. The method according to claim 15, wherein:
the step of forming the groove comprises:
- forming a first groove portion reaching the first n-type layer in the semiconductor stacked body by removing the second n-type layer, the tunnel junction layer, the first p-type layer, and the first active layer in the third region at a same time as the exposing the upper surface of the first n-type layer in the second region; and
- after forming the electrode, forming a second groove portion reaching the substrate below the first groove portion.

* * * * *